United States Patent
Maeno

(10) Patent No.: US 7,495,924 B2
(45) Date of Patent: Feb. 24, 2009

(54) ELECTRONIC DEVICE

(75) Inventor: Kazuhiro Maeno, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 15 days.

(21) Appl. No.: 11/685,670

(22) Filed: Mar. 13, 2007

(65) Prior Publication Data
US 2007/0211433 A1   Sep. 13, 2007

(30) Foreign Application Priority Data
Mar. 13, 2006   (JP) ............... 2006-067360

(51) Int. Cl.
*H05K 7/20*   (2006.01)
(52) U.S. Cl. .................. 361/721; 361/704; 361/707; 361/714; 361/720; 174/16.3; 174/252; 257/712; 257/718
(58) Field of Classification Search ............ 361/702, 361/703, 704, 709–712, 717–721, 736, 742, 361/748, 796; 165/80.3, 104.33, 185; 174/16.3, 174/252; 257/706–727
See application file for complete search history.

(56) References Cited

U.S. PATENT DOCUMENTS 5,930,601 A * 7/1999 Cannizzaro et al. ......... 438/122
6,400,571 B1 * 6/2002 Kimura et al. ............. 361/704
7,009,291 B2 * 3/2006 Oohama ..................... 257/712

FOREIGN PATENT DOCUMENTS

| JP | 02000272153 A | * | 10/2000 |
| JP | 02001196772 A | * | 7/2001 |
| JP | 2004-221111 | | 8/2004 |
| JP | 2004342325 A | * | 12/2004 |

* cited by examiner

*Primary Examiner*—Michael V Datskovskiy
(74) *Attorney, Agent, or Firm*—Woodcock Washburn LLP

(57) ABSTRACT

An electronic device having a heat radiating body, a metal substrate, a heat generating component, and a non-heat-generating component is disclosed. The metal substrate is fixed to the heat radiating body with heat conductive oil arranged between the metal substrate and the heat radiating body. The heat generating component and the non-heat-generating component are mounted on the metal substrate. A gap that permits the heat conductive oil to enter the gap is defined between the metal substrate and the heat radiating body. The gap is arranged at a position corresponding to the non-heat-generating component or a position corresponding to a portion between the heat generating component and the non-heat-generating component.

15 Claims, 5 Drawing Sheets

ELECTRONIC DEVICE

BACKGROUND OF THE INVENTION

The present invention relates to an electronic device formed by fixing a substrate, on which a heat generating component and a non-heat-generating component are mounted, to a heat radiating body.

An electronic device having a substrate secured to a heat radiating body such as an aluminum block or heat sink is known. A heat generating component and a non-heat-generating component are mounted on the substrate. A thus configured electronic device efficiently radiates heat from the heat generating component. For example, a heat generating component mounted on a substrate used in a vehicle generates a relatively great amount of heat. In this case, a metal substrate exhibiting improved heat radiating performance is employed for the substrate.

FIGS. 7A and 7B show an example of an electronic device having a highly heat radiating metal substrate. Specifically, a metal substrate 51 has an aluminum core 52 and an insulating layer 53 formed of resin, which is provided on the core 52. A circuit pattern (not shown) of copper (Cu) is formed on the insulating layer 53. Heat generating components 54 and non-heat-generating components 55 are mounted on the circuit pattern. The metal substrate 51 is fixed to a seat 57 of a heat radiating body (a box-like body) 56 formed of aluminum by means of, for example, three screws 58. In such fixing, a small gap is formed between the backside of the metal substrate 51 and the seat 57. The gap is filled with a silicone grease 59, thus ensuring heat radiation from the heat generating components 54.

In an electronic device described in Japanese Laid-Open Patent Publication No. 2004-221111, referring to FIGS. 8A and 8B, a heat generating component 63 having a metal substrate 62, on which a heat generating element 61 is mounted, is fixed to a heat radiating body 65 by means of bolts 66 through an oil compound 64. A groove 67 is defined in a securing surface of the heat generating component 63 that faces the heat radiating body 65. The securing surface is divided into a plurality of sections by the groove 67. The oil compound 64 is applied onto one of these sections of the securing surface located in the proximity of a position immediately below the heat generating element 61. In correspondence with the groove 67, an optimal application range of the oil compound 64 is determined. Further, the groove 67 prevents excessive oil compound 64 from flowing to the outside of the heat generating component 63. This improves the appearance of the electronic device and facilitates application of the oil compound 64.

Recently, use of lead-free solder has been promoted in mounting of chip components (non-heat-generating components). However, compared to lead-containing eutectic solder, the lead-free solder exhibits low ductility and is fragile. Therefore, if a non-heat-generating component is mounted on a substrate using lead-free solder, soldered joint portions are easily influenced by stress.

In the device of FIGS. 7A and 7B, the backside of the metal substrate 51 and the surface of the seat 57 are not flat but uneven. Therefore, when the metal substrate 51 is simply fixed to the seat 57, the metal substrate 51 contacts the seat 57 through projecting portions. This reduces the contact area between the metal substrate 51 and the seat 57, decreasing heat conductivity. To solve this problem, the silicone grease 59 (heat conductive oil) is applied between the metal substrate 51 and the seat 57. However, if the metal substrate 51 is fixed to the seat 57 by means of the screws 58 with the silicone grease 59 arranged between the metal substrate 51 and the seat 57, the silicone grease 59 causes deformation of the metal substrate 51, applying stress to the non-heat-generating components 55 mounted on the metal substrate 51. Particularly, in a thermal shock test, it was demonstrated that a great stress act on the soldered joint portion of each of the non-heat-generating components 55. Specifically, the stress does not cause a crack in a soldered joint portion between the metal substrate 51 and the seat 57 that are fixed together using eutectic solder. However, a crack and a resulting rupture are easily generated by the stress in a soldered joint portion of the metal substrate 51 and the seat 57 that are fixed together using lead-free solder.

As described in Japanese Laid-Open Patent Publication No. 2004-221111, the groove 67 defined in the securing surface of the heat generating component 63 prevents excessive oil compound 64 from flowing to the outside of the heat generating component 63. Nonetheless, the technique does not describe or suggest a countermeasure to prevent a crack in the soldered joint portions of each non-heat-generating component mounted on the metal substrate, which is caused by the stress produced through warpage of the metal substrate.

SUMMARY OF THE INVENTION

Accordingly, it is an objective of the present invention to provide an electronic device that has a substrate fixed to a heat radiating body with heat conductive oil between the substrate and he heat radiating body and suppresses influence of stress acting on a non-heat-generating component.

To achieve the foregoing objective and in accordance with one aspect of the present invention an electronic device including heat radiating body, a substrate, a heat generating component, and a non-heat-generating component is provided. The substrate is fixed to the heat radiating body with a heat conductive oil arranged between the substrate and the heat radiating body. The heat generating component and the non-heat-generating component are mounted on the substrate. A cap is defined between the substrate and the heat radiating body. The gap permits the heat conductive oil to enter the gap. The gap is arranged at a position corresponding to the non-heat-generating component or a position corresponding to a portion between the heat generating component and the non-heat-generating component.

In accordance with another aspect of the present invention, an electronic device including a substrate, a heat generating component, a non-heat-generating component, and a heat radiating body is provided. The substrate has a first surface and a second surface opposed to the first surface. The heat generating component and the non-heat-generating component are mounted on the first surface. The heat radiating body faces the second surface. The heat radiating body includes a first portion, a second portion, and a recess. The substrate is fixed to the first portion. The second portion contacts a portion of the second surface corresponding to the heat generating component through a heat conductive oil. The recess is provided in a portion except for the first and second portions. The recess defines a gap between the second surface and the heat radiating body, wherein the gap permits the heat conductive oil to enter the gap.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1A:
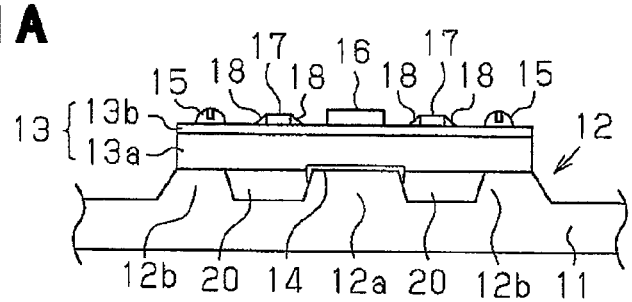
FIG. 1A is a front view schematically showing a heat radiating body and a metal substrate according to one embodiment of the present invention.

An embodiment of the present invention will now be described with reference to FIGS. 1A to 1D and FIG. 2. The drawings schematically show each of the components and the ratios of the dimensions including the width, length, and thickness of the components in the drawings are not equal to the actual values. The drawings other than FIGS. 1A to 1D and FIG. 2 are also illustrated in this manner.

As shown in FIG. 1A, an electronic device has a heat radiating body 11 and a seat 12 is formed in the heat radiating body 11. The seat 12 has a plurality of projections 12a, 12b that face a substrate (a metal substrate) 13. The "seat" refers to a portion of the heat radiating body 11 to which the metal substrate 13 is secured. The metal substrate 13 is securely fastened to the projections 12b by means of screws 15, or fasteners, with a silicone grease 14, or heat conductive oil, arranged between the metal substrate 13 and the projections 12a. The heat radiating body 11 is die-cast from aluminum.

The term "oil" of the "heat conductive oil" refers to a substance exhibiting flowability and viscosity and is not restricted to oils.

The metal substrate 13 has an aluminum core 13a and an insulating layer 13b formed on the upper surface of the core 13a. A circuit pattern (not shown) is provided on the insulating layer 13b. The insulating layer 13b is formed of, for example, epoxy resin and the circuit pattern is formed of copper (Cu). In a state fastened to the seat 12, the screws 15 ground the circuit.

Heat generating components 16 and non-heat-generating components 17 are mounted on the metal substrate 13. Each of the heat generating components 16 is, for example, a power MOS element and each of the non-heat-generating components 17 is, for example, a chip component such as a ceramic capacitor and a chip resistor. The non-heat-generating components 17 are mounted on the metal substrate 13 through solder 18 (see FIGS. 1A and 2). In this embodiment, lead-free solder is used as the solder 18. As the lead-free solder, indium (In) contained solder is employed. For example, a solder with composition of 3.5 wt % of Ag, 0.5 wt % of Bi, 8.0 wt % of In, and Sn is used.

Figure 1B:
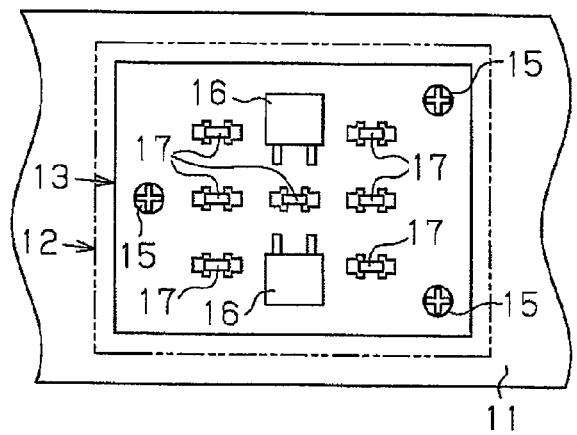
FIG. 1B is a schematic plan view corresponding to FIG. 1A.

With reference to FIG. 1B, the metal substrate 13 has a rectangular shape and secured to the heat radiating body 11 by means of three screws. The portions of the metal substrate 13 fastened by the screws 15 are set at positions in the vicinities of the two corners of one of a pair of parallel shorter sides of the metal substrate 13, and a position near the center of the other shorter side.

Two heat generating components 16 are mounted in middle portions in the longitudinal direction of the metal substrate 13. Specifically, each of the heat generating components 16 is mounted in the vicinity of a corresponding one of a pair of parallel longer sides of the metal substrate 13.

Non-heat-generating components 17 include a non-heat-generating component provided at the center of the metal substrate 13, or between the two heat generating components 16, and six other non-heat-generating components 17. That is, three non-heat-generating components 17 are arranged in each of two opposing areas extending along shorter sides of the metal substrate 13 with the heat generating components 16 arranged between the areas.

Figure 1C:
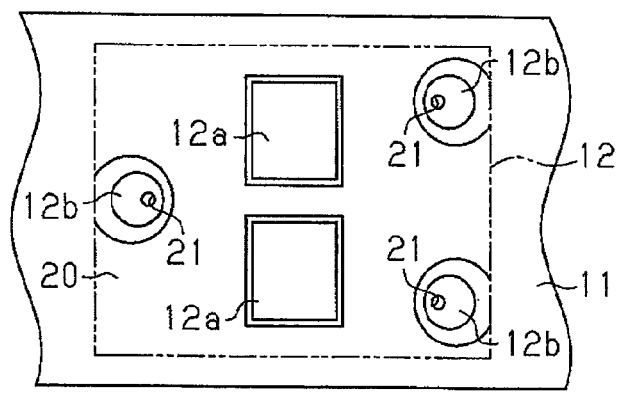
FIG. 1C is a plan view schematically showing the heat radiating body of FIG. 1A.

With reference to FIGS. 1A and 1C, the seat 12 has a recess 20, which is provided in such a manner that the range of the recess 20 covers all of the positions corresponding to the non-heat-generating components 17. The recess 20 defines gaps and a silicone grease 14 is allowed to enter the gaps. Specifically, the recess 20 is provided in a portion of a rectangular area of the seat 12, which is indicated by the chain lines of FIG. 1C, except for the two projections 12a corresponding to the heat generating components 16 and the three projections 12b corresponding to the screws 15. A screw hole 21 is defined in each of the projections 12b. In other words, in the illustrated embodiment, multiple non-heat-generating components 17 are provided in the electronic device. The recess 20 is located in such a manner that the range of the recess 20 covers the positions corresponding to the non-heat-generating components 17.

Figure 1D:
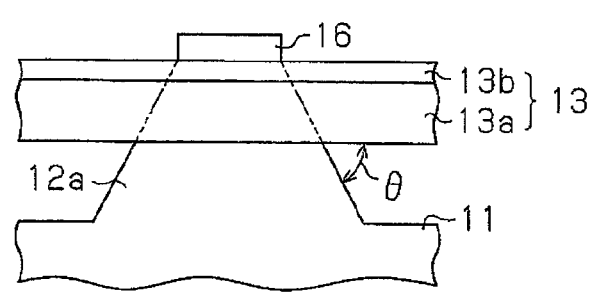
FIG. 1D is an enlarged view schematically showing a portion of FIG. 1A in the vicinity of a heat generating component.
Figure 2:
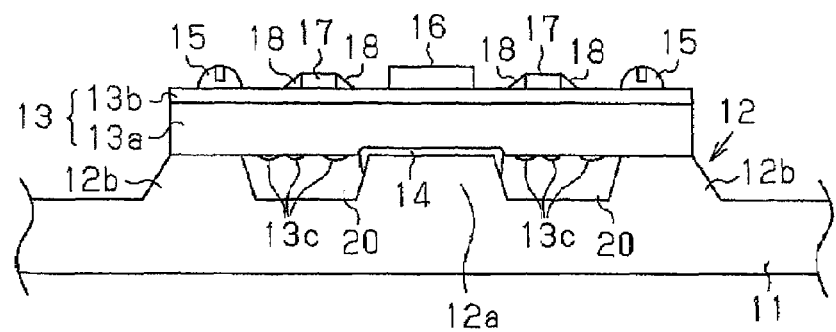
FIG. 2 is a schematic front view for explaining operation of the embodiment of FIGS. 1A to 1D.

Each of the projections 12a is shaped like a truncated pyramid. Each of the projections 12b is substantially shaped like a truncated cone. Referring to FIG. 1D, the slanted two-dotted chain lines at the positions of the metal substrate 13 corresponding to each of the heat generating components 16 indicate the boundaries of the thermal path of the heat generating component 16 with respect to the metal substrate 13. The area inside the slanted lines corresponds to the thermal path. Each projection 12a is formed at the position corresponding to the associated heat generating component 16 to have a shape corresponding to the thermal path of the heat generating component 16. In other words, the projection 12a is shaped in such a manner that the angle between the backside (the bottom surface) of the metal substrate 13 and each inclined surface of the projection 12a becomes 45 degrees in correspondence with the boundaries of the thermal path. The metal substrate 13 is fixed to the heat radiating body 11 with the silicone grease 14 applied onto the upper surfaces (the distal surfaces) of the projections 12a. Referring to FIG. 1D, the boundary of the thermal path in the metal substrate 13 is indicated by the slanted two-dotted chain lines at the positions corresponding to the heat generating component 16 of the metal substrate 13. Specifically, the thermal path corresponds to the portion between the slanted lines.

Operation of the electronic device configured as abovedescribed will hereafter be explained. To fix the metal substrate 13 to the seat 12, the metal substrate 13 is fixed to the heat radiating body 11 by means of the screws 15 after an appropriate amount of silicone grease 14 is applied onto the top surface of each projection 12a using, for example, a syringe. The silicone grease 14 must be applied onto the top surface of each projection 12a only in the portion corresponding to the thermal path of the heat generating component 16 (an applying position).

However, in a conventional case in which the area of the surface of a seat facing a metal substrate 13 is relatively great, it is difficult to accurately determine applying positions of silicone grease and accurately adjust the thickness (the weight) of the silicone grease to be applied. Therefore, to apply a sufficient amount of silicone grease reliably at the applying positions, the silicone grease is applied onto an area greater than the area corresponding to each of the applying positions and by an amount greater than the necessary amount. As a result, spreading of the silicone grease out from the applying positions becomes inevitable. Further, screws are fastened with the silicone grease applied between the portion of the seat corresponding to a non-heat-generating component and the metal substrate. This causes warpage of the metal substrate, applying stress to the non-heat-generating component mounted in the metal substrate, as has been described in the chapter about the background of the invention. A thermal shock test performed on this electronic device demonstrates that a great stress acts on a soldered joint portion of each non-heat-generating component. For example, in a thermal shock test carried out on an electronic device formed using eutectic solder by placing the device alternately in an atmosphere of +90° C. and an atmosphere of −40° C. for repeated 3000 cycles, rupture caused by cracks in a soldered fillet does not occur. Contrastingly, in the same test performed on an electronic device formed using lead-free solder, rupture occurs in a soldered fillet. Particularly, a greater stress acts on the non-heat-generating component arranged on the line extending on the fastening positions of the screws.

However, in the illustrated embodiment, the silicone grease 14 is applied onto only the projections 12a corresponding to the heat generating components 16. Even if an excess of silicone grease 14 is applied, the silicone grease 14 enters the recess 20 when the metal substrate 13 is fixed to the heat radiating body 11 by means of the screws 15. This makes it easy to apply the silicone grease 14 uniformly onto desired portions in accordance with an optimal thickness. Also, in the embodiment, the silicone grease 14 is not provided between the portions of the seat 12 corresponding to the non-heatgenerating components 17 and the metal substrate 13. This reduces deforming stress acting on the metal substrate 13 when the screws 15 are fastened. As a result, the above-described thermal shock test performed on the electronic device of this embodiment demonstrates that rupture caused by cracks does not occur in the device.

If the silicone grease 14 enters any one of the screw holes 21, defective conduction may be caused when the substrate 13 is fixedly fastened by the screws 15. To avoid this, in a conventional electronic device, a groove is defined around a screw fastening portion (a screw hole) of the seat 12. In this case, if an excess of silicone grease 14 is applied onto the seat 12, the silicone grease 14 may flow from the groove and enter the screw holes 21. However, in this embodiment, the size of the recess 20 defined around the corresponding one of the projections 12a, 12b is greater than the size of the groove of the conventional case. This prevents the silicone grease 14 from entering the screw holes 21 of the projections 12b even if an excess of silicone grease 14 is applied onto the projections 12a. As a result, defective conduction is reliably avoided after the screws 15 are fastened.

Further, the recess 20 is provided in the portion of the seat 12 except for the portions corresponding to the heat generating components 16 and the portions corresponding to the screws 15. Therefore, as exaggeratedly illustrated in FIG. 2, small projections 13c formed on the backside of the metal substrate 13 are received in the recess 20. This decreases the extent of undesired influence on the metal substrate 13 by the silicone grease 14 arranged in the portions between the seat 12 and the metal substrate 13 corresponding to the non-heatgenerating components 17, while reducing deforming stress caused by contact between the projections 13c on the backside of the metal substrate 13 and the seat 12 at positions corresponding to virtual lines connecting the fastening portions of the multiple screws 15.

The illustrated embodiment has the following advantages.

(1) The electronic device is formed by fixing the metal substrate 13, on which the heat generating components 16 and the non-heat-generating components 17 are mounted, to the heat radiating body 11 through the silicone grease 14. The recess 20 is defined in the electronic device at the positions corresponding to the non-heat-generating components 17 between the heat radiating body 11 and the metal substrate 13. The recess 20 provides gaps heat receive the silicone grease 14. Therefore, even if the silicone grease 14 enters the portions corresponding to the non-heat-generating components 17 between the heat radiating body 11 and the metal substrate 13 after having been applied at the applying positions, the silicone grease 14 is retained in the gaps. This suppresses influence on the non-heat-generating components 17 by stress caused by the silicone grease 14 located at the positions corresponding to the non-heat-generating components 17. Therefore, the non-heat-generating components 17 can be mounted on the metal substrate 13 using lead-free solder. Also, it is unnecessary to define grooves around the screw holes 21 with which the corresponding screws 15 are engaged to prevent the silicone grease 14 from entering the screw holes 21.

(2) The recess 20 is provided in the heat radiating body 11. The caps may be defined by a recess defined in at least one of the heat radiating body 11 and the metal substrate 13. However, the thickness of the metal substrate 13 is typically thinner than that of the heat radiating body 11. Further, if a circuit is formed in the interior of the metal substrate 13, it is difficult to define the recess 20 in the metal substrate 13 as desired. Contrastingly, the recess 20 can be provided in the heat radiating body 11 as desired without being restricted by the structure of the heat radiating body 11. Also, it is possible to mount the non-heat-generating components 17 at the positions on the backside of the metal substrate 13 corresponding to the recess 20, or the surface of the metal substrate 13 that faces the heat radiating body 11.

(3) The multiple non-heat-generating components 17 are arranged on the metal substrate 13. The recess 20 is defined at the position corresponding to all of the non-heat-generating components 17. Further, the extent of the stress acting on each non-heat-generating component 17 varies depending on the type of the non-heat-generating component 17. Therefore, if some of the non-heat-generating components 17 arranged on the metal substrate 13 are easily influenced by stress and the others are not, it is unnecessary to provide gaps at all of the positions corresponding to the non-heat-generating components 17. Nonetheless, if the gaps are provided at all of these positions, it is unnecessary to determine which of the non-heat-generating components 17 are more easily influenced by stress.

(4) The multiple non-heat-generating components 17 are mounted on the metal substrate 13. The recess 20 is provided in such a manner that the range of the recess 20 covers the non-heat-generating components 17. Alternatively, recesses 20 may be provided only at the positions corresponding to the non-heat-generating components 17. However, in the case in which the recess 20 is provided in such a manner that the range of the recess 20 covers the multiple non-heat-generating components 17, the weight of the electronic device is more effectively reduced. Further, undesired mutual influences between the projections and the recesses of the opposing surfaces of the metal substrate 13 and the heat radiating body 11 are suppressed.

(5) The recess 20 is provided in the portion between the heat radiating body 11 and the metal substrate 13 except for the portions corresponding to the entire portions of the surfaces of the heat generating components 16 that face the metal substrate 13. Therefore, when the heat generating components 16 generate heat, the heat is efficiently transmitted from the entire portions of the surfaces of the heat generating components 16 that face the metal substrate 13 to the heat radiating body 11 through the metal substrate 13 and the silicone grease 14. The heat generating components 16 are thus effectively cooled. Also, the silicone grease 14 can be easily applied at desired positions by an optimal amount.

(6) Each of the projections 12a is shaped in correspondence with the thermal path of the corresponding heat generating component 16. This effectively radiates the heat generated by the heat generating components 16 and reduces the weight of the electronic device.

(7) The metal substrate 13 is fixed to the heat radiating body 11 by means of the screws 15. This allows easy and reliable fixation of the metal substrate 13 to the heat radiating body 11 compared to a case in which such fixation is brought about using rivets or adhesive.

(8) In the non-heat-generating components 17, which are mounted on the metal substrate 13 through the solder 18, generation of cracks in a soldered fillet is suppressed by the recess 20. The structure of the present invention is thus effectively applicable to an electronic device in which the non-heat-generating components 17 are mounted on the metal substrate 13 using solder.

The present invention is not restricted to the illustrated embodiment but may be embodied, for example, in the following forms.

Figure 3A:
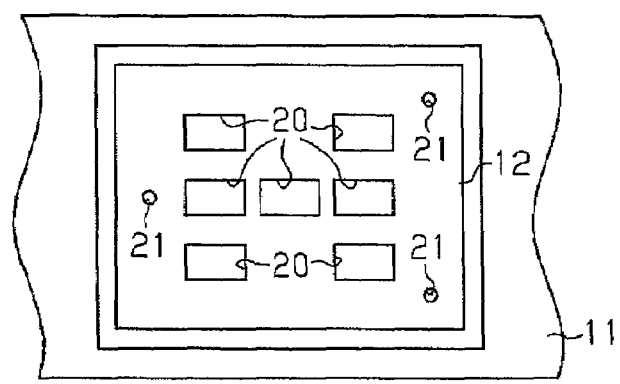
FIGS. 3A and 3B are plan views each schematically showing a heat radiating body of another embodiment of the present invention.
Figure 3B:
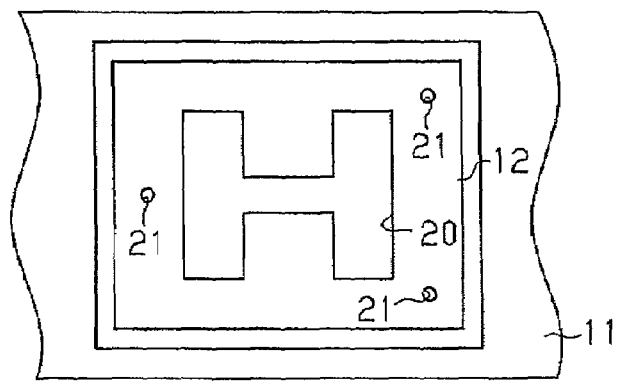

As shown in FIG. 3A, recesses 20 may be provided solely in the portions of the seat 12 corresponding to the non-heat-generating components 17. Alternatively, referring to FIG. 3B, the recess 20 may have a shape formed by connecting the portions of the seat 12 corresponding to the non-heat-generating components 17.

Figure 4A:
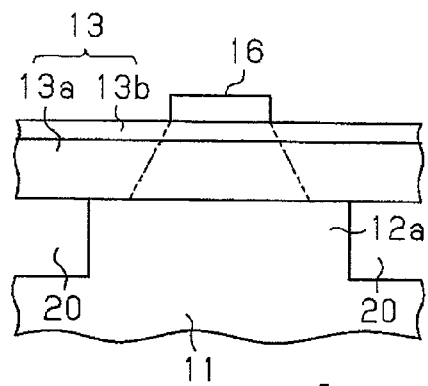
FIGS. 4A to 4C are schematic enlarged views each showing a portion in the vicinity of a heat generating component according to another embodiment of the present invention.

The shape of each projection 12a is not restricted to a truncated pyramid corresponding to the thermal path of the associated heat generating component 16. As illustrated in FIG. 4A, the projection 12a may have a rectangular prism-like shape the size of which is greater than that of the thermal path of the heat generating component 16.

Figure 4B:
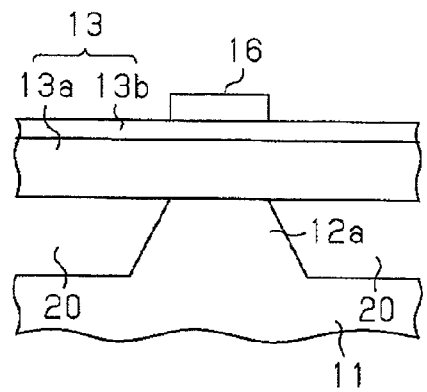
Figure 4C:
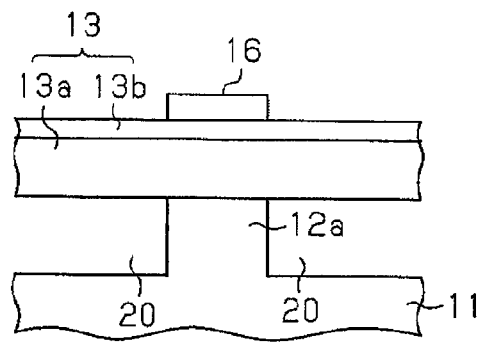

With reference to FIGS. 4B and 4C, each projection 12a may have a truncated pyramid-like shape or a rectangular prism-like shape having a distal end with a width equal to the width of the bottom of the associated heat generating component 16. This further effectively reduces the weight of the electronic device. Alternatively, as long as sufficient heat radiating performance is ensured, each projection 12a may have a truncated pyramid-like shape or a rectangular prism-like shape having a distal end with a width smaller than the width of the bottom of the heat generating component 16.

The depth of the recess 20 is not restricted to the value equal to the height (the projecting amount) of the seat 12 but may be greater or smaller than the height of the seat 12.

Figure 5A:
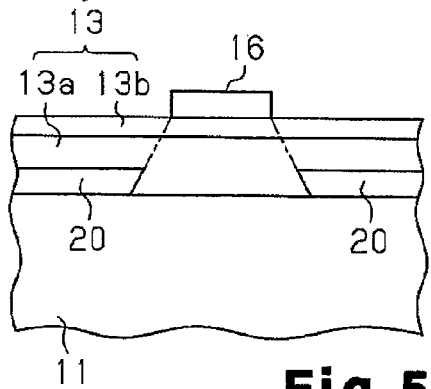
FIGS. 5A to 5C are schematic enlarged views each showing a portion in the vicinity of a heat generating component according to another embodiment of the present invention.
Figure 5B:
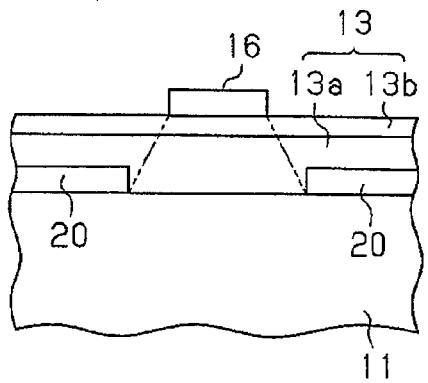
Figure 5C:
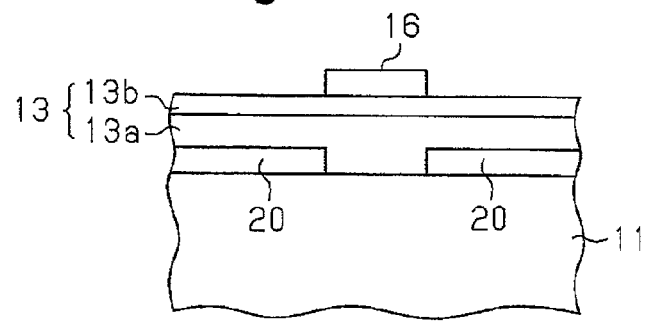

The recess 20 may be defined in the metal substrate 13. For example, referring to FIG. 5A, the recess 20 may be shaped in such a manner as to contact the portions of the metal substrate 13 corresponding to the thermal paths of the heat generating components 16. Further, referring to FIG. 5B, the recess 20 may be provided outward from the portions of the metal substrate 13 corresponding to the thermal paths of the heat generating components 16. Alternatively, referring to FIG. 5C, the recess 20 may be shaped in such a manner as to avoid he portions of the metal substrate 13 opposed to the heat generating components 16 in accordance with a rectangular prism-like shape. In these cases, by machining the metal substrate 13, the heat radiating body 11 formed in the same manner as a heat radiating body of a conventional electronic device can be applied to the metal substrate 13.

Figure 6A:
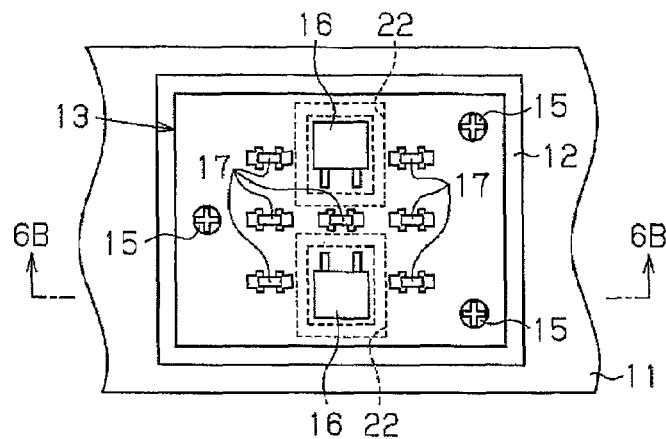
FIG. 6A is a plan view schematically showing a heat radiating body and a metal subsrate according to another embodiment of the present invention.
Figure 6B:
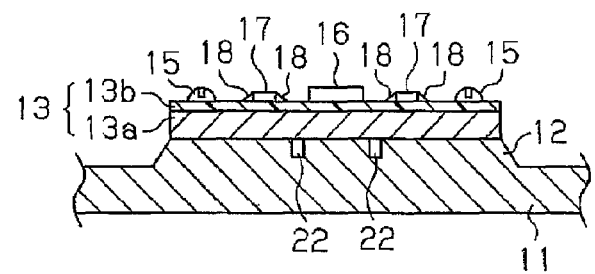
FIG. 6B is a schematic cross-sectional view taken along line 6B-6B of FIG. 6A.

The gaps do not necessarily have to be defined in the heat radiating body 11 that faces the metal substrate 13 at the positions corresponding to the non-heat-generating components 17. The gaps may be provided between the heat radiating body 11 and the metal substrate 13 at the positions corresponding to the portions between the heat generating components 16 and the non-heat-generating components 17. The silicone grease 14 is allowed to enter the gaps. For example, as illustrated in FIGS. 6A and 6B, the gaps may be defined as grooves 22 each having a shape encompassing a portion of the heat radiating body 11 corresponding to the associated heat generating component 16. Even in the electronic device having this configuration, the metal substrate 13 can be fixed to the heat radiating body 11 with the silicone grease 14 applied onto the portions surrounded by the walls of the grooves 22. Further, even if the amount of the silicone grease 14 applied onto the heat radiating body 11 is greater than an optimal amount, the silicone grease 14 can be retained in the grooves 22. The silicone grease 14 is thus prevented from reaching the positions corresponding to the non-heat-generating components 17. This suppresses influence on the non-heat-generating components 17 by stress caused by the silicone grease 14 located at the positions corresponding to the non-heat-generating components 17. Therefore, lead-free solder can be used also for mounting the non-heat-generating components 17 on the metal substrate 13.

The grooves 22 do not necessarily have to have the shape encompassing the portion of the heat radiating body 11 corresponding to the associated heat generating component 16.

Figure 6C:
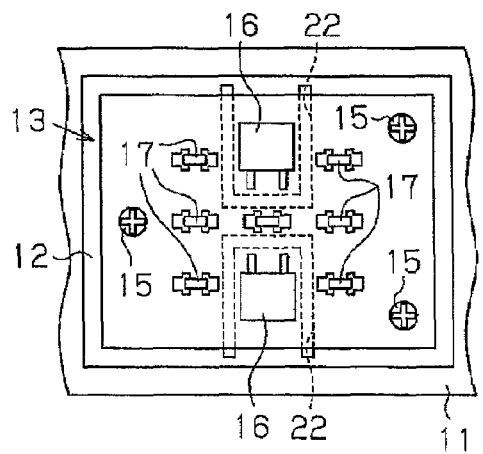
FIGS. 6C and 6D are plan views each schematically showing a heat radiating body and a metal substrate according to another embodiment of the present invention.
Figure 6D:
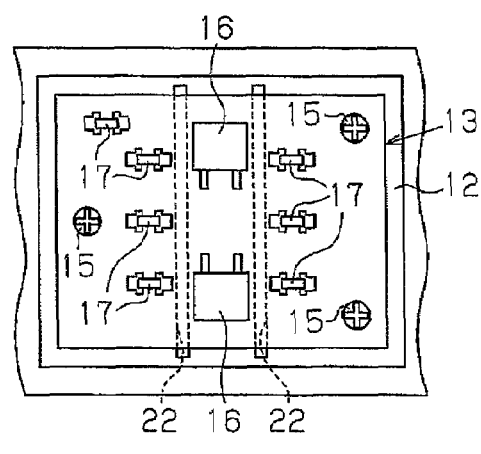
Figure 7A:
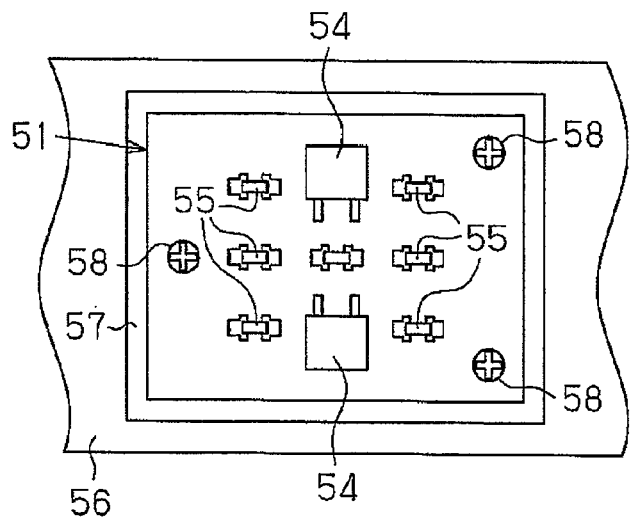
FIG. 7A is a plan view schematically showing a heat radiating body and a metal substrate of the prior art.
Figure 7B:
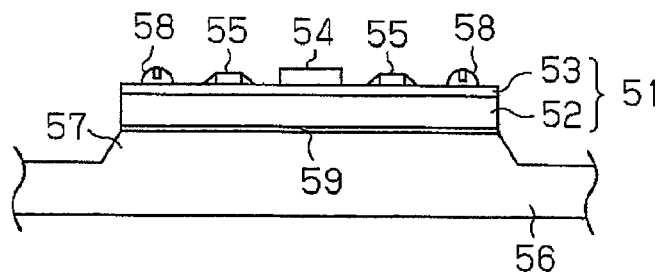
FIG. 7B is a schematic front view corresponding to FIG. 7A.
Figure 8A:
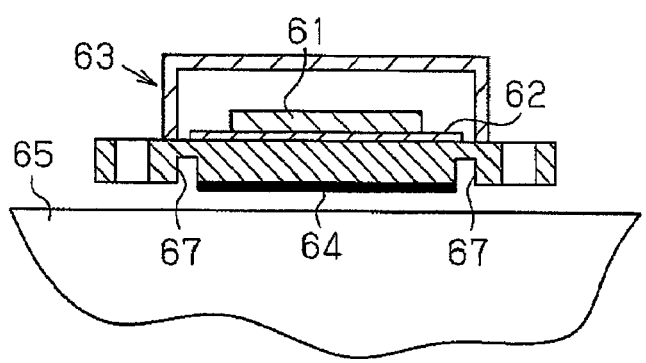
FIG. 8A is a cross-sectional view schematically showing a heat radiating body and a metal substrate of the prior art.
Figure 8B:
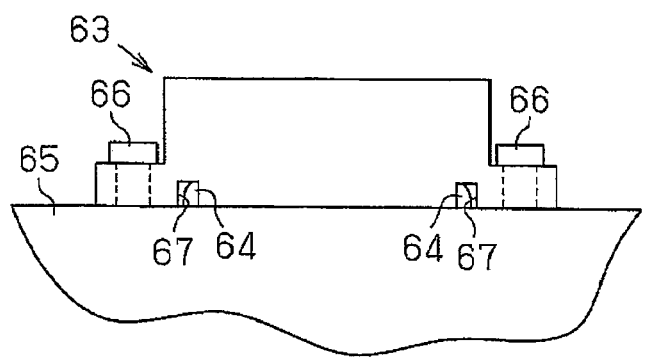
FIG. 8B is a schematic front view corresponding to FIG. 8A.

With reference to FIG. 6C, each groove 22 may have a substantial U-shape having opposed ends opening in a side surface of the seat 12. Also, referring to FIG. 6D, if a non-heat-generating component 17 is not arranged at the center of the metal substrate 13, the grooves 22 may be shaped as two linear grooves each having opposed ends opening in corresponding side surfaces of the seat 12.

The recess 20 may be defined not only in the heat radiating body 11 but also in the metal substrate 13 in such a manner that a resulting gap is located commonly in the heat radiating body 11 and the metal substrate 13.

Fixing of the metal substrate 13 to the heat radiating body 11 is not restricted to the three-point fixation structure. Such fixation may be accomplished at two points or four or more points.

The number of the heat generating components 16 and the number of the non-heat-generating components 17 are not restricted to those in the above illustrated embodiments but may be altered as long as such number is at least one. Further, the locations of the heat generating components 16 and the locations of the non-heat-generating components 17 may be altered as needed.

The metal substrate 13 may be fixed to the heat radiating body 11 using rivets or adhesive instead of the screws 15.

The heat radiating body 11 does not necessarily have to project from the upper surface of the heat radiating body 11. That is, the corresponding surfaces of the seat 12 and the heat radiating body 11 may extend on a common plane. Nonetheless, the seat 12 is formed by die-casting the heat radiating body 11 and subsequent cutting and finishing of surfaces of the heat radiating body 11. Therefore, it is preferred that the seat 12 project with respect to the other surfaces.

The composition of Ag, Bi, In, and Sn of the indium (In) contained solder used as the lead-free solder may be different from that of the illustrated embodiment. Further, any suitable type of solder other than the indium (In) contained type may be used as the lead-free solder.

The invention claimed is:

1. An electronic device comprising:
a heat radiating body;
a substrate fixed to the heat radiating body with a heat conductive oil arranged between the substrate and the heat radiating body; and
a heat generating component and a non-heat-generating component mounted on the substrate,
wherein a gap is defined between the substrate and the heat radiating body, the gap permitting the heat conductive oil to enter the gap, the gap being arranged at a position corresponding to the non-heat-generating component.

2. The device according to claim 1, wherein the non-heat-generating component is one a plurality of non-heat-generating components, the gap being arranged in such a manner as to ensure a thermal path for transmitting heat generated by the heat generating component to the heat radiating body through the substrate, and at a position corresponding to at least one of the non-heat-generating components.

3. The device according to claim 1, wherein the gap is defined by a recess provided in the heat radiating body.

4. The device according to claim 1, wherein the non-heat-generating component is one of a plurality of non-heat-generating components, the gap is arranged such that each non-heat-generating component is located at a position corresponding to the range of the gap.

5. An electronic device comprising:
a heat radiating body;
a substrate fixed to the heat radiating body with a heat conductive oil arranged between the substrate and the heat radiating body; and
a heat generating component and a plurality of non-heat-generating components mounted on the substrate,
wherein a gap is defined between the substrate and the heat radiating body, the gap permitting the heat conductive oil to enter the gap, the gap being provided in such a manner that the range of the gap covers the positions corresponding to the non-heat-generating components.

6. The device according to claim 2, wherein the gap is arranged in a portion except for a portion corresponding to an entire portion of a surface of the heat generating component facing the substrate.

7. The device according to claim 6, wherein the gap is shaped in such a manner as to avoid the thermal path for transmitting the heat generated by the heat generating component to the heat radiating body through the substrate.

8. The device according to claim 1, wherein the gap is defined as a groove having a shape encompassing a portion corresponding to the heat generating component.

9. The device according to claim 1, wherein the substrate is fixed to the heat radiating body by means of a screw.

10. The device according to claim 1, wherein the heat radiating body has a first portion and a second portion, wherein the substrate is fixed to the first portion, the first portion being located at a surface of the heat radiating body that faces the substrate, and the second portion contacts a portion of the substrate corresponding to the heat generating component through the heat conductive oil, and wherein the gap is defined by providing a recess in a portion of the heat radiating body except for the first and second portions.

11. The device according to claim 1, wherein the non-heat-generating component is mounted on the substrate using a solder, and wherein the gap suppresses cracking of a soldered fillet.

12. An electronic device comprising:
a substrate having a first surface and a second surface opposed to the first surface;
a heat generating component and a non-heat-generating component mounted on the first surface; and
a heat radiating body facing the second surface, the heat radiating body including a first portion, a second portion, and a recess, wherein the substrate is fixed to the first portion, the second portion contacts a portion of the second surface corresponding to the heat generating component through a heat conductive oil, and the recess is provided in a portion except for the first and second portions, the heat conductive oil being applied onto only the second portion, the recess defining a gap between the second surface and the heat radiating body, wherein the gap permits the heat conductive oil to enter the gap.

13. An electronic device comprising:
a heat radiating body;
a substrate fixed to the heat radiating body with a heat conductive oil arranged between the substrate and the heat radiating body; and
a heat generating component and a non-heat-generating component mounted on the substrate,
wherein the heat conductive oil is applied onto only a portion corresponding to the heat generating component, and wherein a gap is defined between the substrate and the heat radiating body, the gap permitting the heat conductive oil to enter the gap, the gap being arranged at a position corresponding to the non-heat-generating component or a position corresponding to a portion between the heat generating component and the non-heat-generating component.

14. The device according to claim 1, wherein the gap is arranged in a portion except for a portion corresponding to an entire portion of a surface of the heat generating component facing the substrate.

15. The device according to claim 14, wherein the gap is shaped in such a manner as to avoid the thermal path for transmitting the heat generated by the heat generating component to the heat radiating body through the substrate.

* * * * *